United States Patent [19]

Adair et al.

[11] Patent Number: 4,954,414

[45] Date of Patent: Sep. 4, 1990

[54] PHOTOSENSITIVE COMPOSITION CONTAINING A TRANSITION METAL COORDINATION COMPLEX CATION AND A BORATE ANION AND PHOTOSENSITIVE MATERIALS EMPLOYING THE SAME

[75] Inventors: Paul C. Adair, Springboro; Peter Gottschalk, Centerville, both of Ohio

[73] Assignee: The Mead Corporation, Dayton, Ohio

[21] Appl. No.: 268,433

[22] Filed: Nov. 8, 1988

[51] Int. Cl.[5] .................. G03C 1/78; G03C 1/495; G03C 1/68
[52] U.S. Cl. .................. 430/138; 430/281; 430/914; 430/936; 430/917; 522/66; 522/26; 522/28; 522/29; 522/63; 522/64; 540/3; 540/4; 544/229; 544/225; 546/2; 546/8; 546/13; 549/3; 549/4; 556/7
[58] Field of Search .................. 544/229, 225; 540/3, 540/4; 546/2, 8, 13; 549/3, 4; 556/7; 522/66, 26, 28, 29, 63, 64; 430/138, 281, 914, 936, 917

[56] References Cited

U.S. PATENT DOCUMENTS 4,707,432 11/1987 Gatechair et al. .............. 522/28 X
4,772,530 9/1988 Gottschalk et al. .............. 430/138
4,842,980 6/1989 Gottschalk et al. .............. 430/138

FOREIGN PATENT DOCUMENTS 0126712 11/1984 European Pat. Off. .............. 522/29
0152377 8/1985 European Pat. Off. .............. 522/28

OTHER PUBLICATIONS

R. G. Bhattacharyya et al., *Inorganic Nuclear Chemisty Letters*, vol. 16, No. 9-12 (1980), pp. 571-574.

*Primary Examiner*—Marion C. McCamish
*Assistant Examiner*—Cynthia Hamilton
*Attorney, Agent, or Firm*—Thompson, Hine and Flory

[57] ABSTRACT

A composition including a cationic transition metal coordination complex and a borate anion, wherein said composition is capable of absorbing actinic radiation and producing free radicals which can initiate free radical addition polymerization of a free radical addition polymerizable or crosslinkable monomer is disclosed. The compositions are particularly useful as visible light photoinitiators.

37 Claims, No Drawings

PHOTOSENSITIVE COMPOSITION CONTAINING A TRANSITION METAL COORDINATION COMPLEX CATION AND A BORATE ANION AND PHOTOSENSITIVE MATERIALS EMPLOYING THE SAME

BACKGROUND OF THE INVENTION

1. Field of the Invention

The present invention relates to photosensitive compositions, and more particularly, to compositions which include a cationic transition metal coordination complex and a borate anion. These inventive compositions are capable of absorbing actinic radiation and producing free radicals which can initiate polymerization of a free radical addition polymerizable or crosslinkable monomer.

2 Description of the Prior Art

U.S. Pat. Nos. 4,399,209 and 4,440,846 to The Mead Corporation describe imaging materials and imaging processes in which images are formed through exposure-controlled release of an image-forming agent from a microcapsule containing a photohardenable composition. The photohardenable composition typically includes an ethylenically unsaturated monomer and a photoinitiator material which is capable of absorbing actinic radiation and producing free radicals to initiate free radical polymerization of the ethylenic monomer. To produce an image, the imaging material is image-wise exposed to actinic radiation and the microcapsules are subjected to a uniform rupturing force. Typically the image-forming agent is a colorless color precursor which is image-wise released from the microcapsules to a developer sheet whereupon it reacts with a developer material to form a visible image.

U.S. patent application Ser. No. 339,917, filed Jan. 18, 1982 (corresponding to U.K. Pat. No. 2,113,860), and U.S. Pat. No. 4,576,891 disclose a full color imaging system wherein three sets of microcapsules which are sensitive to different bands of actinic radiation are employed. These microcapsules respectively contain cyan, magenta and yellow color precursors. The absorption characteristics of the three sets of microcapsules in these photosensitive materials must be sufficiently different that the cyan-forming capsules can be differentially hardened at a predetermined wavelength or over a predetermined wavelength band without hardening the magenta or yellowforming capsules and, likewise, sufficiently different that the magenta-forming and yellow-forming capsules can be selectively hardened upon exposure respectively to second and third wavelengths or wavelength bands, without hardening the cyan-forming capsules or hardening the other of the yellow-forming or magenta-forming capsules. Microcapsules having this characteristic (i.e., cyan-, magenta- and yellow-forming capsules which can be selectively hardened by exposure at distinct wavelengths without cross-exposure) are referred to herein as having "distinctly different sensitivities."

U.S. Pat. No. 4,772,541, also assigned to The Mead Corporation disclose photohardenable compositions including visible light-sensitive photoinitiators. The photoinitiators preferably comprise cationic dye-borate anion complexes represented by the formula

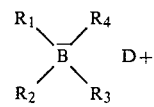

wherein $D^+$ is a cationic dye, and $R_1$, $R_2$, $R_3$ and $R_4$ are independently selected from the group consisting of alkyl, aryl, alkaryl, allyl, aralkyl, alkenyl, alkynyl, alicyclic and saturated or unsaturated heterocyclic groups. In practice, the cyan, magenta and yellow color-forming microcapsules are respectively sensitive to red (650 nm), green (550 nm) and blue (450 nm) light, and contain photoinitiators which are sensitive to these wavelengths.

Transition metal coordination complexes capable of photoexcitation have been studied in the literature. See, for example, Sutin and Creutz, "Properties and Reactivities of the Luminescent Excited States of Polypyridine Complexes of Ruthenium (II) and Osmium (II)", *Inorganic and Organometallic Photochemistry*, pp. 1–27, 1978; Flynn and Demas, "Synthesis and Luminescence of the Tris(2,2'-bipyridine) iridium (III) Ion", *Journal of the American Chemical Society*, Vol. 96, pp. 1959–1960, 1974; Reitz et al., "Interand Intramolecular Excited-State Interactions of Surfactantactive Rhenium (I) Photosensitizers", *Journal of the American Chemical Society*, Vol. 110, pp. 5051–5058, 1988; Kober et al., "Synthetic Control of Excited States Nonchromophoric Ligand Variations in Polypyridyl Complexes of Osmium (II)", *Inorganic Chemistry*, Vol. 24, pp. 2755–2763, 1985; Creutz and Sutin, "Electron-Transfer Reactions of Excited States Reductive Quenching of the Tris(2,2'-bipyridine) ruthenium (II) Luminescence", *Inorganic Chemistry*, Vol 15, pp. 496–499, 1976.

SUMMARY OF THE INVENTION

It has now been discovered that compounds which contain a cationic transition metal coordination complex and a borate anion are useful photoinitiators of free radical addition reactions The transition metal atom forming the coordination complex is preferably a transition metal atom having a $d^6$ orbital configuration. Further, it has also been discovered that the initiator works particularly well if one or more of the ligands attached to the metal cation contains a pyridinium group and is bi-or tri-dentate.

The mechanism whereby the compound containing the cationic transition metal coordination complex and the borate anion absorbs energy and generates free radicals is not entirely clear. It is hypothesized that upon exposure of the compound to actinic radiation, the metal atom in the coordination complex absorbs light and shifts one or more metal-centered electrons to the attached ligands. This is known in the art as metal to ligand charge transfer (MLCT). After MLCT, the borate anion reacts with the coordination complex by a mechanism which is not clear to form a radical which initiates free radical addition polymerization or crosslinking of a polymerizable or crosslinkable species. The presumed mechanism is oxidation of the borate anion which decomposes to form a triaryl borane and an alkyl radical. See, Chatterjee et al., "Electron-Transfer Reactions in Cyanine Borate Ion Pairs: Photopolymerization Initiators Sensitive to Visible Light", *Journal of the American Chemical Society*, 1988, Vol. 110, pp. 2326–2328.

One of the particular advantages of these initiators is the ability to select from a large number of cationic transition metal coordination complexes which absorb at substantially different wavelengths. The absorption characteristics of the initiators are principally determined by the absorption of the coordination complex. Thus, by selecting a complex which absorbs at 400 nm or greater, the sensitivity of the photosensitive material can be extended well into the visible range.

The initiator compositions of the present invention are useful in any photohardenable composition polymerizable by free radical polymerization. They are particularly useful in providing full color photosensitive materials in which the photohardenable compositions are microencapsulated. In these materials, a layer including three sets of microcapsules having distinct sensitivity characteristics is provided on a support. Each set of microcapsules respectively contains a cyan, magenta, or yellow color-forming agent. Because of the extension of the sensitivities well into the visible spectrum, the sensitivities of the three photoinitiators selected may be sufficiently spaced apart to prevent unwanted cross-exposure of different color-forming microcapsules. Photoinitiators can be designed for use in the cyan-, magenta-, and yellow-forming capsules which are respectively sensitive to red, green and blue light.

In comparison to the above-described prior art systems utilizing cationic dye-borate anion complexes as photoinitiators, the initiators of the present invention can enable the use of two or more quenching borate anions per cation, thus improving efficiency of photogeneration of free radicals. In addition they are more soluble in water and other polar solvents and therefore they can be used in higher concentrations in compositions containing more polar monomers.

A principal object of the present invention is to provide a novel photoinitiator which includes a cationic complex of a transition metal and a borate anion in solution in a polymerizable material.

In accordance with one embodiment, the present invention is a photohardenable composition including a cationic transition metal coordination complex and a borate anion, and a free radical addition polymerizable or crosslinkable material wherein said composition is capable of absorbing actinic radiation and producing free radicals which can initiate free radical addition polymerization or crosslinking of the free radical addition polymerizable or crosslinkable material It is particularly preferred that the transition metal atom have a $d^6$ orbital configuration. It is further preferred that the metal atom have one or more pyridinium-group containing ligands covalently bonded to it. The transition metal coordination complex and the borate anion may be present in the composition as separate ions or may form an ion pair.

A further embodiment of the present invention provides a photosensitive material. The material comprises a support having a layer of the above-defined photohardenable composition. It is particularly preferred that the composition contain an image-forming agent and that the composition be maintained as an internal phase which is surrounded by microcapsule walls. It is also preferred that the photosensitive material be used in an imaging system whereupon it image-wise hardens as a result of being exposed to actinic radiation, particularly visible light.

In still another embodiment, the photosensitive material is useful for forming full-color images. When forming full-color images, the support has a layer of photosensitive microcapsules including a first set of microcapsules having a cyan image-forming agent associated therewith, a second set of microcapsules having a magenta image-forming agent associated therewith, and a third set of microcapsules having a yellow image-forming agent associated therewith, wherein at least one of the three sets of microcapsules contains an internal phase which includes the above-defined photohardenable composition.

Accordingly, it is an object of the present invention to provide a composition which is capable of initiating free radical polymerization as a result of exposure to visible or near-ultraviolet light An additional object of the present invention is to provide a free radical photoinitiator composition which is more soluble in polar materials.

These, and other objects will be understood by those skilled in the art as reference is made to the detailed description of the preferred embodiment.

DETAILED DESCRIPTION OF THE PREFERRED EMBODIMENT

While describing the preferred embodiments, certain terminology will be utilized for the sake of clarity. It is to be understood that such terminology includes not only the recited embodiments, but all technical equivalents which perform substantially the same function in substantially the same way to obtain the same result U.S. Pat. Nos. 4,399,209, 4,440,846, 4,772,530 and 4,772,541 are incorporated herein by reference to the extent that reference thereto may be necessary to complete this disclosure.

The inventive compositions include both a cationic transition metal coordination complex and a borate anion. The cationic complex and the borate anion may be present in a photohardenable composition as individual ions (dissociated) or associated as an ion pair. When present as an ion pair the initiator can be represented by the general formula (I):

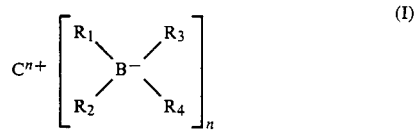

where $C^{n+}$ is a cationic transition metal coordination complex; $R_1$, $R_2$, $R_3$ and $R_4$ are independently selected from the group consisting of alkyl, aryl, alkaryl, allyl, aralkyl, alkenyl, alkynyl, alicyclic and saturated or unsaturated heterocyclic groups; and n is an integer ranging from 1 to 3.

The complex $C^{n+}$ is preferably represented by the general Formula (II):

$$[ML_x]^{n+} \qquad (II)$$

wherein M represents a central transition metal atom; L represents one or more identical or different ligands covalently bonded to the central transition metal atom; x is an integer ranging from 2 to 6; and n is an integer ranging from 1 to 3. In the preferred embodiment, the complex cation has a coordination number of 6, although the complex may have a coordination number of 4,5,7 or 8.

The transition metal atom is located at the center of the coordination complex. In the preferred embodiment, the metal atom has a $d^6$ orbital configuration according to the valence bond hybridization method of classifying orbital configurations. Examples of useful atoms include Re(I), Fe(II), Ru(II), Os(II), Co(III), and Ir(III). Ru(II) has been found to be particularly suitable for use in the present invention. Other transition metal atoms may be utilized in accordance with the present invention as long as they form a coordination complex capable of metal to ligand charge transfer when covalently bonded to one or more ligands when photoexcited.

At least one of the ligands is selected so that upon exposure of the complex to actinic radiation, electrons are transferred from the metal atom to the ligands. This is preferably accomplished by selecting a ligand which possesses one or more unoccupied low-lying pi orbitals capable of accepting the transferred electrons according to the molecular orbital theory In particular, bidentate ligands (ligands which bond at two sites of the center metal atom) and tridentate ligands (ligands which bond at three sites of the center metal atom) have proved to be successful, and bidentate and tridentate ligands containing one or more heterocyclic groups having one or more nitrogen atoms are especially preferred.

Examples of ligands which are capable of bonding with the transition metal atom to produce a photosensitive transition metal coordination complex include pyridine (pyr) and substituted pyridines, 2,2'-bipyridine (bipy), 4,4'-dimethyl-2,2'-bipyridine ($Me_2bipy$), 1,10-phenanthroline (phen), 3,4,7,8-tetramethyl-1,10-phenanthroline ($Me_4phen$), 2,2',2''-terpyridine (terpy), 5,6-dimethyl-1,10-phenanthroline ($5,6-(CH_3)_2phen$), 5-methyl-1,10-phenanthroline ($5-(CH_3)phen$), 5-chloro-1,10-phenanthroline ($5-Cl(phen)$), 5-nitro-1,10-phenanthroline ($5-NO_2$ phen), 4,7-dimethyl-1,10-phenanthroline ($4,7-(CH_3)_2phen$), and 2,4,6-tri(2-pyridyl-s-triazine)(TPTZ) and substituted derivatives thereof.

The transition metal coordination complexes suited for use in the present invention may be commercially obtained or synthesized. Examples of photosensitive transition metal coordination complexes include $Co(bipy)_3^{2+}$, $Ru(terpy)_2^{2+}$, $Ru(Me_2bipy)(bipy)_2^{2+}$, $Ru(Me_2bipy)_3^{2+}$, $Ru(phen)_3^{2+}$, $Fe(Me_2bipy)_3^{2+}$, $Ru(bipy)_3^{2+}$, $Ru(phen)(bipy)_2^{2+}$ and $Ir(Me_2bipy)_2Cl_2^+$. The following complexes, while not having been tested, are also believed to be useful: $Ru(5,6(CH_2)_2phen)_3^{2+}$, $Ru(5-(CH_3)phen)_3^{2+}$, $Ru(5-Cl(phen))_3^{2+}$, $Ru(5-NO_2-phen)_3^{2+}$, $Os(Me_2bipy)_3^{2+}$, $Os(bipy)_3^{2+}$, $Os(5,6-(CH_3)_2phen)_3^{2+}$, $Os(5-Cl(phen))_3^{2+}$, $Os(5-(CH_3)phen)_3^{2+}$, $Os(phen)_3^{2+}$, $Ru(4,7-(CH_3)_2phen)_3^{2+}$, $Ru(TPTZ)_3^{2+}$, $Ir(bipy)_3^{3+}$, $Re[(bipy)(CO)_3NC(CH_2)_nCH_3]^+$ (n=0-17), $Zn(bipy)^{2+}$, $Zn(bipy)_3^{2+}$, $Os(terpy)_2^{2+}$, $Os(Me_4phen)_2(cis-bis(1,2-diphenylphosphino)-ethylene)^{2+}$, $Os(phen)_2-(MeCN)_2^{2+}$, $Os(phen)_2(dimethylphenylphosphine)_2^{2+}$, $Os(bipy)_2(bis(diphenylphosphino)methane)^{2+}$, $Os(phen)_2(cis-bis(1,2-diphenylphosphino)ethylene)^{2+}$, $Os(bipy)(o-phenylenebis(dimethylarsine))_2^{2+}$, $Os(bipy)_2(DMSO)_2^{2+}$, $Os(bipy)(cis-bis(1,2-diphenylphosphino)ethylene)^{2+}$. The transition metal coordination complexes are characterized by being capable of transferring an electron from the central metal atom to the attached ligands when exposed to actinic radiation. It is particularly preferred that the electron transfer be initiated when the complex cation is exposed to visible light. However, depending on the absorption sensitivity of the complex cation, other sources of actinic radiation, such as ultraviolet light may be selected.

The borate anion is designed such that the borate radical generated upon exposure to light and after electron transfer to the cation readily dissociates with the formation of a radical as follows:

$$BR_4 \rightarrow BR_3 + R.$$

For example, particularly preferred anions are triphenylbutylborate and trianisylbutylborate anions because they readily dissociate to triphenylborane or trianisylborane and a butyl radical. On the other hand tetrabutylborate anion does not work well presumably because the tetrabutylborate radical is not stable and it readily accepts an electron back from the dye in a back electron transfer and does not dissociate efficiently. Likewise, tetraphenylborate anion is very poor because the phenyl radical is not easily formed.

Preferably, at least one but not more than three of $R^1$, $R^2$, $R^3$, and $R^4$ is an alkyl group. Each of $R^1$, $R^2$, $R^3$, and $R^4$ can contain up to 20 carbon atoms, and they typically contain 1 to 7 carbon atoms More preferably $R^1$-$R^4$ are a combination of alkyl group(s) and aryl group(s) or aralkyl group(s) and still more preferably a combination of three aryl groups and one alkyl group. For example, it has been discovered that (tris(p-t-butyl phenyl))butyl borate and (tris phenyl) hexyl borate can successfully complex with the transition metal coordination complex cation to form a free radical photoinitiator.

Representative examples of alkyl groups represented by $R^1$-$R^4$ are methyl, ethyl, propyl, butyl, pentyl, hexyl, octyl, stearyl, etc. The alkyl groups may be substituted, for example, by one or more halogen, cyano, acyloxy, acyl, alkoxy or hydroxy groups.

Representative examples of aryl groups represented by $R^1$-$R^4$ include phenyl, naphthyl and substituted aryl groups such as anisyl and alkaryl such as methylphenyl, dimethylphenyl, etc. Representative examples of aralkyl groups represented by $R^1$-$R^4$ groups include benzyl. Representative alicyclic groups include cyclobutyl, cyclopentyl, and cyclohexyl groups. Examples of an alkynyl group are propynyl and ethynyl, and examples of alkenyl groups include a vinyl group.

As a general rule, useful transition metal coordination complex cation-borate anion complexes must be identified empirically, however, potentially useful cationic and borate anion combinations can be identified by reference to the Weller equation (Rehm, D. and Weller, A., *Isr. J Chem.* (1970), 8, 259–271), which can be simplified as follows.

$$\Delta G = E_{ox} - E_{red} - E_h\nu$$

where $\Delta G$ is the change in the Gibbs free energy, $E_{ox}$ is the oxidation potential of the borate anion $BR_4^-$, $E_{red}$ is the reduction potential of the complex and $E_h\nu$ is the energy of light used to excite the cation Useful complexes will have a negative free energy change. Similarly, the difference between the reduction potential of the cation and the oxidation potential of the borate must be negative for the complex to be dark stable, i.e., Eox−Ered>0.

As indicated, the Weller equation is a simplification and it does not absolutely predict whether a complex will be useful in the present invention or not. There are a number of other factors which will influence this determination. One such factor is the effect of the monomer on the complex. It is also known that if the Weller equation produces too negative a value, deviations from the equation are possible. Furthermore, the Weller equation only predicts electron transfer, it does not predict whether a particular complex is an efficient initiator of polymerization. The equation is a useful first approximation.

The initiators of the present invention can be prepared by mixing together two solutions, the first containing a salt of the transition metal coordination complex (e.g., a halogen salt dissolved in water), and the second containing the borate anion, typically as a sodium or ammonium salt of the borate anion dissolved in an organic solvent, and isolating the resultant product. The resultant material containing the cation-anion pair of the present invention is water or oil soluble and is particularly useful as a free radical photoinitiator.

The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The transition metal coordination complex cation-borate anion initiator is usually used in an amount up to about 25 percent by weight based on the weight of the photopolymerizable or crosslinkable species in the photohardenable composition. More typically, the transition metal coordination complex cation-borate anion initiator is used in an amount of about 0.1 to 10 percent by weight.

While the transition metal coordination complex cation-borate anion initiator can be used alone as the initiator, film speeds may be quite slow and oxygen inhibition may occur. It has been found that it is preferable to use the initiator in combination with an autoxidizer and/or other additive materials. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para- positions by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, N-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino- N,N-dimethylaniline, 3-hydroxy-N,N-dimethylaniline, N,N,N',N'-tetramethyl-1,4-dianiline, 4-acetamido-N,N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

It may also be desirable to utilize an additional material to improve the photosensitive properties of the initiator system. Examples of these compounds include acylthiohydroxamates, 2-mercaptobenzothiazole, 6-ethoxy-2-mercaptobenzothiazole, 2-mercaptobenzoxazole and phenylmercaptotetrazole. Disulfides of the above listed thiol compounds are also useful compounds.

The autoxidizers and/or additive compounds are preferably used in the present invention in concentrations of about 0.1 to 10 percent by weight.

The photohardenable compositions of the present invention can be coated upon a support in a conventional manner and used as a photoresist or in photolithography to form a polymer image; or they can be encapsulated as described in U.S. Pat. Nos. 4,399,209 and 4,440,846 and used to control the release of an image-forming agent. The latter processes typically involve image-wise exposing the photosensitive material to actinic radiation and subjecting the layer of microcapsules to a uniform rupturing force such as pressure, abrasion, or ultrasonic energy.

Several processes can be used to form color images as explained in U.K. Pat. No. 2,113,860 and U.S. Pat. No. 4,772,541. If microcapsules containing cyan, magenta and yellow image-forming agents are sensitive to red, green and blue light, images can be formed by direct transmission or reflection imaging or by image processing. Image processing may involve forming color separations (color-seps) corresponding to the red, green and blue component images and sequentially exposing the photosensitive material to three distinct banks of radiation hereinafter designated $\lambda$-1, $\lambda$-2, and $\lambda$-3 sources through each color separation. Otherwise, it may involve electronic processing in which the image or subject to be recorded is viewed through a Dunn or matrix camera and the output from the camera electronically drives three exposure sources corresponding to $\lambda$-1, $\lambda$-2, and $\lambda$-3.

While the discussion herein relates to forming 3-color full color images, 4-color images are also possible. For example, microcapsules containing cyan, magenta, yellow, and black image-forming agents can be provided which have distinct sensitivities at four wavelengths, e.g., $\lambda$-1, $\lambda$-2, $\lambda$-3, and $\lambda$-4.

In accordance with the invention, at least one set of the microcapsules in a full color system contains a composition including a cationic transition metal coordination complex and a borate anion. The other sets also may include similar types of photoinitiators, or they may contain conventional photoinitiators.

In accordance with the preferred embodiments of the invention, a full color imaging system is provided in which three sets of microcapsules containing cyan, magenta and yellow image-forming agents are sensitive to red, green, and blue light respectively. The photosensitive composition in at least one and possibly all three sets of microcapsules are sensitized by photoinitiators containing a transition metal coordination complex cation and a borate anion. For optimum color balance, the microcapsules are sensitive (λmax) at about 450 nm, 550 nm, and 650 nm, respectively Such a system is useful with visible light sources in direct transmission or reflection imaging. Such a material is useful in making copies of full-color originals or contact or projected prints of color photographic slides. They are also useful in electronic imaging using lasers or pencil light sources of appropriate wavelengths.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which are responsive to changes in the internal phase viscosity in terms of their ability to rupture. Because the borate tends to be acid sensitive, encapsulation procedures conducted at higher pH (e.g., greater than about 6) are preferred.

Oil and water soluble materials have been encapsulated in hydrophilic wall-forming materials such as gelatin-type materials (see U.S. Pat. Nos. 2,730,456 and 2,800,457 to Green et al.) including gum arabic, polyvinyl alcohol, carboxy-methylcellulose; resorcinol-formaldehyde wall formers (see U.S. Pat. No. 3,755,190 to Hart, et al); isocyanate wall-formers (see U.S Pat. No. 3,914,511 to Vassiliades); isocyanate-polyol wall-formers (see U.S. Pat. No. 3,796,669 to Kiritani et al); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat No. 4,025,455 to Shackle). Because the inventive photoinitiator compositions are water soluble, the artisan may have greater selectivity in choosing an encapsulation procedure and in choosing microcapsule walls.

Urea-resorcinol-formaldehyde and melamine-formaldehyde capsules with low oxygen permeability are preferred. In some cases to reduce oxygen permeability it is desirable to form a double walled capsule by conducting encapsulation in two stages.

A capsule size should be selected which minimizes light attenuation. The mean diameter of the capsules used in this invention typically ranges from approximately 1 to 25 microns. As a general rule, image resolution improves as the capsule size decreases. If the capsules become too small, they may disappear in the pores or the fiber of the substrate. These very small capsules may therefore be screened from exposure by the substrate. They may also fail to rupture when exposed to pressure or other rupturing means. In view of these problems, it has been determined that a preferred mean capsule diameter range is from approximately 3 to 10 microns. Technically, however, the capsules can range in size up to the point where they become visible to the human eye.

An open phase system may also be used in accordance with the invention instead of an encapsulated one. This can be done by dispersing what would otherwise be the capsule contents throughout the coating on the substrate as discrete droplets. Suitable coatings for this embodiment include polymer binders whose viscosity has been adjusted to match the dispersion required in the coating. Suitable binders are gelatin, polyvinyl alcohol, polyacrylamide, and acrylic lattices. Whenever reference is made to "capsules" and "encapsulation" without reference to a discretre capsule wall in this specification or the appended claims, those terms are intended to include the alternative of an open phase system.

The photosensitive material of the present invention can be used to control the interaction of various image-forming agents.

In one embodiment of the present invention the capsules may contain a benign visible dye in the internal phase in which case images are formed by contacting the exposed imaging material under pressure with a plain paper or a paper treated to enhance its affinity for the visible dye. A benign dye is a colored dye which does not interfere with the imaging photochemistry, for example, by relaxing the excited state of the initiator or detrimentally absorbing or attenuating the exposure radiation.

In preferred embodiment of the invention, images are formed through the reaction of a pair of chromogenic materials such as a color precursor and a color developer, either of which may be encapsulated with the photohardenable composition and function as the image-forming agent. In general, these materials include colorless electron donating type compounds and are well known in the art. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone, Copikem X, IV and XI and commercially available cyan, magenta and yellow colorless color-forming agents are often used. The color formers can be used alone or in combination.

The developer materials conventionally employed in carbonless paper technology are also useful in the present invention. Illustrative examples are clay minerals such as acid clay, active clay, attapulgite, etc.; organic acids such as tannic acid, gallic acid, propyl gallate, etc.; acid polymers such as phenol-formaldehyde reins, phenol acetylene condensation resins, condensates between an organic carboxylic acid having at lease one hydroxy group and formaldehyde, etc.; metal salts or aromatic carboxylic acids such as zinc salicylate, tin salicylate, zinc 2-hydroxy naphthoate, zinc 3,5 di-tert butyl salicylate, zinc 3,5-di(α-methylbenzyl) salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. Particularly preferred developers are described in U.S. application Ser. No. 073,036, filed July 14, 1987.

As indicated in U.S. Pat. Nos. 4,399,209 and 4,440,846, the developer may be present on the photosensitive sheet (providing a so-called self-contained system) or on a separate developer sheet.

In self-contained systems, the developer may be provided in a single layer underlying the microcapsules as disclosed in U.S. Pat. No. 4,440,846. Alternatively, the color former and the color developer may be individually encapsulated in photosensitive capsules and upon exposure both capsule sets image-wise rupture releasing color former and developer which mix to form the image. Alternatively, the developer can be encapsulated in non-photosensitive capsules such that upon processing all developer capsules rupture and release developer but the color former containing capsules rupture in only the unexposed or underexposed area which are the only areas where the color former and developer mix. Still another alternative is to encapsulate the developer in photosensitive capsules and the color former in non-photosensitive capsules The present invention is not necessarily limited to embodiments where the image-forming agent is present in the internal phase. Rather, this agent may be present in the capsule wall of a discrete capsule or in the binder of an open phase system or in a binder or coating used in combination with discrete capsules or an open phase system designed such that the image-wise ruptured capsules release a solvent for the image-forming agent. Embodiments are also envisioned in which a dye or chromogenic material is fixed in a capsule wall or binder and is released by interaction with the internal phase upon rupturing the capsules.

The most common substrate for this invention is a synthetic film and preferably a metallized film.

The photoinitiators of the present invention may have additional practical uses other than in imaging systems. Some of these uses include, but are not limited to, use in radiation-curable inks, use in an adhesive for laminating transparent or translucent materials together, use in magnetic recording compositions, use in dental adhesives and dental compositions, use in producing holograms by photopolymer holography, use in forming three dimensional models from monomer solutions, and use in underwater coatings.

Synthesis Example 1 illustrates the preparation of an inventive composition containing a transition metal coordination complex cation and a borate anion.

SYNTHESIS EXAMPLE 1

1.0 gram of $Ru(bipy)_3Cl_2$ were dissolved in 50 ml of deionized water. 1.59 grams of the tetramethyl ammonium salt of tris(p-t-butylphenyl) butyl borate was dissolved in 55.5 ml of ethyl acetate. The two solutions were mixed together in a beaker, and stirred at 60 r.p.m. at room temperature for 30 minutes. A large amount of red colored liquid was deposited on the beaker walls. After stirring, the contents of the beaker were transferred to a separatory funnel where the contents separated into a pale green colored aqueous phase and a reddish-yellow colored organic phase. The aqueous phase was removed and discarded. The liquid from the organic phase was evaporated on a rotary evaporator to yield a reddish colored oil. Both this oil, as well as the reddish oil deposited on the beaker walls were washed with hexane to yield 2.0098 grams of a red solid. The percent yield was nearly quantitative.

EXAMPLE 1

The red solid produced in Synthesis Example 1 (0.1 gram) and 25 grams of trimethylolpropane triacrylate (TMPTA) were mixed together and heated at 60° C. for 30 minutes to form a yellow solution. Most of the solid dissolved in the TMPTA. Drops of the yellow solution were placed on glass microscope slides and the slides were exposed to light from one F15-Cool White Fluorescent tube at a distance of 4 inches. After 16 seconds, the drops solidified and thereby cemented the glass slides together. This indicates that the composition of Synthesis Example 1 effectively initiated polymerization of the TMPTA by generating free radicals as a result of exposure to visible light. $\lambda$Max of the composition is 450 nm.

EXAMPLE 2

2,6-Diisopropyl-N,N-dimethylaniline, a known autoxidizer(0.5 grams) was added to the solution of Example 1. A few drops of the solution were placed between two glass slides and the experiment of Example 1 was repeated. The slides were cemented in 6 seconds.

EXAMPLE 3

0.5 grams of the commerically available chloride salt of $Co(bipy)_3^{+2}$ was dissolved in 75 to 150 ml of deionized water. A stoichiometric amount of the tetramethyl ammonium salt of tris(p-t-butyl phenyl)butyl borate was dissolved in 75 to 150 ml of ethyl acetate. The two solutions were poured together and stirred for 30 minutes at room temperature. The mixture was poured into a separatory funnel and shaken. The organic layer was recovered and dried with magnesium sulfate. The ethyl acetate was removed by rotary evaporation. The resultant metal borate salt was collected in 90-95% yield.

EXAMPLE 4

1.0 gram of (cis-dichlorobis(2,2'-bipyridine) ruthenium(II) hydrate and a 1.1 molar excess of 4,4'-dimethyl-2,2'-bipyridine were placed into 150 grams of reagent grade alcohol. The mixture was heated at reflux for 20 hours to turn the solution a transparent reddish-yellow color. The solvent was removed by rotary evaporation and the resultant solid was washed several times with hexane to obtain a quantitative yield of a chloride salt of a cationic transition metal coordination complex. 0.5 grams of the salt were mixed with a stoichiometric amount of the tetramethyl ammonium salt of tris(p-t-butyl phenyl)butyl borate using the method of Example 3 to form a photoinitiator composition. The resultant composition was collected in 90-95% yield.

EXAMPLE 5

1.0 gram of Ruthenium(III) chloride hydrate and a 3.1 molar excess of 4,4'-dimethyl-2,2'-bipyridine were placed into 150 grams of reagent grade ethanol and the solution was refluxed for three days to turn the solution a transparent reddish-yellow color. The solution was treated as in Example 4 to produce a chloride salt of a cationic transition metal coordination complex 0.5 grams of the salt were mixed with a stoichometric amount of the tetramethyl ammonium salt of tris(p-t-butyl phenyl) butyl borate using the method of Example 3 to form a photoinitiator composition. The composition was collected in 90-95% yield.

EXAMPLE 6

0.5 grams of the commercially available chloride salt of Ru(terpy)$_2$$^{+2}$ were mixed with a stoichiometric amount of the tetramethyl ammonium salt of tris(p-t-butyl phenyl) butyl borate using the procedure of Example 3 to form a photoinitiator composition. The composition was collected in 90–95% yield.

EXAMPLE 7

0.5 grams of the commercially available chloride salt of Ru(phen)$_3$$^{+2}$ were mixed with a stoichiometric amount of the tetramethyl ammonium salt of tris(p-t-butyl phenyl) butyl borate using the procedure of Example 3 to form a photoinitiator composition. The resultant composition was collected in 90–95% yield.

EXAMPLE 8

0.5 grams of the commercially available chloride salt of Fe(Me$_2$bipy)$_3$$^{+2}$ were mixed with a stoichiometric amount of the tetramethyl ammonium salt of tris(p-t-butyl phenyl) butyl borate using the procedure of Example 3 to form a photoinitiator composition. The composition was collected in 90–95% yield.

EXAMPLE 9

1.0 gram of cis-dichlorobis (2,2'-bipyridine)ruthenium(II) hydrate and a 1.1 molar excess of 1,10-phenanthroline were reacted according to the procedure set forth in Example 4 to form a chloride salt of a cationic transition metal coordination complex. 0.5 grams of the salt were mixed with a stoichiometric amount of the tetramethyl ammonium salt of tris(p-t-butyl phenyl) butyl borate using the method of Example 3 to form a photoinitiator composition. The resultant composition was collected in 90–95% yield.

EXAMPLE 10

1.0 gram of cis-dichlorobis-(2,2'-bipyridine)ruthenium(II) hydrate and a 1.1 molar excess of 5-chloro-1,10-phenanthroline were reacted according to the procedure set forth in Example 4 to form a chloride salt of a cationic transition metal coordination complex. 0.5 grams of the salt were mixed with a stoichiometric amount of the tetramethyl ammonium salt of tris(p-t-butyl phenyl) butyl borate using the method of Example 3 to form a photoinitiator compostion. The resultant composition was collected in 90–95% yield.

EXAMPLE 11

1.0 gram of Iridium (III) chloride and a 2.1 molar excess of 2,2'-bipyridine were refluxed in 250 grams of reagent grade ethanol for three days. During this time the solution changed from black to pale yellow and the solvent was removed by rotary evaporation to yield a yellow solid. 0.5 grams of the yellow solid were mixed with an equimolar amount of the tetramethyl ammonium salt of tris(p-t-butyl phenyl) butyl borate using the method of Example 3 to form a photoinitiator composition. The resultant composition was collected in 90–95% yield.

EXAMPLE 12

0.5 grams of the commercially available chloride salt of Ru(bipy)$_3$$^{+2}$ were mixed with a stoichiometric amount of the tetramethyl ammonium salt of tris-phenyl hexyl borate using the procedure of Example 3 to form a photoinitiator composition. The composition was collected in 90–95% yield.

EXAMPLE 13

0.5 grams of the chloride salt produced according to Example 10 were mixed with an equimolar amount of the tetramethyl ammonium salt of tris-phenyl hexyl borate using the procedure of Example 3 to form a photoinitiator composition. The composition was collected in 90–95% yield.

Transition metal coordination complex cation-borate anion photoinitiators synthesized by the above described examples are shown in the following table with their λmax. The abbreviation "borate-1" represents (tris(p-t-butyl phenyl))butyl borate and the abbreviation "borate-2" represents (trisphenyl)hexyl borate.

TABLE 1

| Example No. | Structure | λmax (TMPTA) |
|---|---|---|
| 3 | Co(bipy)$_3$(borate-1)$_2$ | <350 nm |
| 4 | Ru(Me$_2$bipy)(bipy)$_2$(borate-1)$_2$ | 458 nm |
| 5 | Ru(Me$_2$bipy)$_3$(borate-1)$_2$ | 464 nm |
| 6 | Ru(terpy)$_2$(borate-1)$_2$ | 480 nm |
| 7 | Ru(phen)$_3$(borate-1)$_2$ | 420 nm |
| 8 | Fe(Me$_2$bipy)$_3$(borate-1)$_2$ | 532 nm |
| 9 | Ru(bipy)$_3$(borate-1)$_2$ | 454 nm |
| 10 | Ru(Cl-phen)(bipy)$_2$(borate-1)$_2$ | 452 nm |
| 11 | (Ir(Me$_2$bipy)$_2$Cl$_2$)(borate-1) | 336 nm |
| 12 | Ru(bipy)$_3$(borate-2)$_2$ | 454 nm |
| 13 | (Ir(Me$_2$bipy)$_2$Cl$_2$)(borate-2) | 338 nm |

The photoinitiator compositions of Examples 3–13 were tested using the following procedure. 0.1 grams of the initiator were added to 25 grams of trimethylolpropane triacrylate (TMPTA) by heating the TMPTA to 60° C. while stirring. One drop of the resultant composition was placed between two glass microscope slides and the slides were exposed to either one cool white fluoroscent tube (GE F15T8-CW) or one black light fluoroscent tube (GE F15T8-BLB) at a distance of 10 cm. The exposure times required for first notable polymerization (FNP) and complete slide immobilization (CSI) are set forth in Table 2. As an additional experiment 0.25 grams of 2,6-diisopropyl-N,N-dimethyl aniline (DIDMA), a known autoxidizer, were added to the TMPTA/photoinitiator composition prior to application to the microscope slides. The times of first notable polymerization and complete slide immobilization for these samples are also shown in Table 2.

TABLE 2

| Sample | Cool White Exposure | | Black Light Exposure | |
|---|---|---|---|---|
| | FNP (sec) | CSI (sec) | FNP (sec) | CSI (sec) |
| Example 3 | >120 | >120 | >120 | >120 |
| Example 3 + DIDMA | 64 | 67 | 37 | 39 |
| Example 4 | 17 | 20 | >60 | >60 |
| Example 4 + DIDMA | 3 | 4 | 6 | 9 |
| Example 5 | 16 | 19 | 23 | 27 |
| Example 5 + DIDMA | 2 | 3 | 4 | 8 |
| Example 6 | >60 | >60 | >60 | >60 |
| Example 6 + DIDMA | 23 | 25 | 41 | 46 |
| Example 7 | >60 | >60 | >60 | >60 |
| Example 7 + DIDMA | 6 | 7 | 18 | 22 |
| Example 8 | >120 | >120 | >120 | >120 |
| Example 8 + DIDMA | 64 | 67 | >120 | >120 |
| Example 9 | 7 | 10 | 11 | 16 |
| Example 9 + | 3 | 5 | 7 | 12 |

TABLE 2-continued

| Sample | Cool White Exposure | | Black Light Exposure | |
| --- | --- | --- | --- | --- |
| | FNP (sec) | CSI (sec) | FNP (sec) | CSI (sec) |
| DIDMA | | | | |
| Example 10 | 6 | 8 | 11 | 15 |
| Example 10 + DIDMA | 3 | 5 | 5 | 8 |
| Example 11 | >120 | >120 | 53 | 56 |
| Example 11 + DIDMA | 49 | 54 | 16 | 18 |
| Example 12 | 25 | 30 | 80 | 85 |
| Example 12 + DIDMA | 14 | 18 | 21 | 30 |
| Example 13 | >120 | >120 | >120 | >120 |
| Example 13 + DIDMA | 57 | 67 | 14 | 22 |

The initiator compositions of the present invention achieve a great number of advantages. First, because of their sensitivity to visible light, they can be successfully used as visible light initiators. By changing the ligands attached to the center metal atom, the solubility characteristics of the initiator, as well as the absorption sensitivity, can be altered and controlled. Further, by changing the center metal atom, the absorbance may be altered to successfully cooperate with the light source selected for photopolymerization.

Having described the invention in detail and by reference to preferred embodiments thereof, it will be apparent that modifications and variations are possible without departing from the scope of the invention defined in the appended claims.

What is claimed is:

1. A photoinitiator including a cationic transition metal coordination complex and a borate anion wherein said borate anion is represented by the following formula:

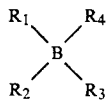

wherein $R_1$, $R_2$, $R_3$ and $R_4$ are the same or different and are selected from the group consisting of alkyl, aryl, aralkyl, alkaryl, alkenyl, alkynyl, alicyclic, heterocyclic, and allyl groups, and wherein said photoinitiator is capable of absorbing actinic radiation and producing free radicals.

2. The photoinitiator according to claim 1 wherein three of said $R_1$, $R_2$, $R_3$ and $R_4$ groups are aryl and one of said $R_1$, $R_2$, $R_3$ and $R_4$ groups is alkyl.

3. The photoinitiator according to claim 2 wherein said cationic transition metal coordination complex is a complex of a transition metal atom having a $d^6$ orbital configuration and one or more ligands covalently bonded to said transition metal atom so that said complex is capable of underdoing metal to ligand charge transfer upon photoexcitation.

4. The photoinitiator according to claim 3 wherein said cationic transition metal coordination complex includes a transition metal selected from the group consisting of Re(I), Fe(II), Ru(II), Os(II), Co(III) and Ir(III).

5. The photoinitiator according to claim 4 wherein said cationic transition metal coordination complex and said borate anion are present as an ion pair.

6. The photoinitiator according to claim 5 wherein at least one of said ligands includes a heterocyclic group containing a nitrogen atom.

7. The photoinitiator according to claim 6 wherein at least one of said ligands is selected from the group consisting of pyridine, 2,2'-bipyridine, 4,4'-dimethyl-2,2'-bipyridine, 1,10-phenanthroline, 3,4,7,8-tetramethyl-1,10-phenanthroline, 2,2',2''-terpyridine, 5,6-dimethyl-1,10-phenanthroline, 5-methyl-1,10-phenanthroline, 5-chloro-1,10-phenanthroline, 5-nitro-1,10-phenanthroline, 4,7-dimethyl-1,10-phenanthroline and 2,4,6-tri(2-pyridyl-s-triazine and substituted derivatives thereof.

8. The photoinitiator according to claim 5 wherein one or more of said ligands is a bidentate or tridentate ligand.

9. The photoinitiator according to claim 1 wherein said photoinitiator is capable of absorbing actinic radiation and producing free radicals as a result of exposure to light emitted from a visible or near ultraviolet light source.

10. A photoresist material comprising a free radical addition polymerizable or crosslinkable compound and a photoinitiator including a cationic transition metal coordination complex and a borate anion wherein said borate anion is represented by the following formula:

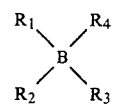

wherein $R_1$, $R_2$, $R_3$ and $R_4$ are the same or different and are selected from the group consisting of alkyl, aryl, aralkyl, alkaryl, alkenyl, alkynyl, alicyclic, heterocyclic, and allyl groups, and wherein said photoinitiator is capable of absorbing actinic radiation and producing free radicals which can initiate free radical polymerization of said polymerizable or crosslinkable compound.

11. The material composition according to claim 10 wherein three of said $R_1$, $R_2$, $R_3$ and $R_4$ groups are aryl and one of said $R_1$, $R_2$, $R_3$ and $R_4$ groups is alkyl.

12. The material according to claim 10 wherein said cationic transition metal coordination complex is a complex of a transition metal atom having a $d^6$ orbital configuration and one or more ligands covalently bonded to said transition metal atom so that said complex is capable of undergoing metal to ligand charge transfer upon photoexcitation.

13. The material according to claim 12 wherein said cationic transition metal coordination complex includes a transition metal atom selected from the group consisting of Re(I), Fe(II), Ru(II), Os(II), Co(III) and Ir(III).

14. The material according to claim 13 wherein said cationic transition metal coordination complex and said borate anion are present as an ion pair.

15. The material according to claim 14 wherein at least one of said ligands includes a hetercyclic group containing a nitrogen atom.

16. The material according to claim 15 wherein at least one of said ligands is selected from the group consisting of pyridine, 2,2'-bipyridine, 4,4'-dimethyl-2,2'-bipyridine, 1,10-phenanthroline, 3,4,7,8-tetramethyl-1,10-phenanthroline, 2,2',2''-terpyridine, 5,6-dimethyl-1,10-phenanthroline, 5-methyl-1,10-phenanthroline, 5-chloro-1,10-phenanthroline, 5-nitro-1,10-phenanthroline, 4,7-dimethyl-1,10-phenanthroline and 2,4,6-tri(2-pyridyl-s-triazine) and substituted derivatives thereof.

17. The material according to claim 14 wherein at least one of said ligands is a bidentate or tridentate ligand.

18. The material according to claim 10 wherein said photoinitiator is capable of absorbing actinic radiation and producing free radicals as a result of exposure to light emitted from a visible light source.

19. The material according to claim 10 wherein said compound is an ethylenically unsaturated compound.

20. The material according to claim 10 wherein said composition is microencapsulated.

21. The material according to claim 20 wherein said photoinitiator additionally comprises an autoxidizer.

22. A photosensitive material comprising a support having a layer of a photohardenable composition on the surface thereof, said composition comprising a free radical addition polymerizable or crosslinkable compound and a photoinitiator including a cationic transition metal coordination complex and a borate anion wherein said borate anion is represented by the following formula:

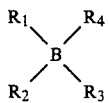

where $R_1$, $R_2$, $R_3$ and $R_4$ are the same or different and are selected from the group consisting of alkyl, aryl, aralkyl, alkaryl, alkenyl, alkynyl, alicyclic, heterocyclic, and allyl groups, and wherein said photoinitiator is capable of absorbing actinic radiation and producing free radicals which can initiate free radical polymerization of said polymerizable or crosslinkable compound.

23. The material according to claim 22 wherein said composition is microencapsulated.

24. The material according to claim 22 wherein three of said $R_1$, $R_2$, $R_3$ and $R_4$ groups are aryl and one of said $R_1$, $R_2$, $R_3$ and $R_4$ groups is alkyl.

25. The material according to claim 25 wherein said cationic transition metal coordination complex is a complex of a transition metal atom having a $d^6$ orbital configuration and one or more ligands covalently bonded to said transition metal atom so that said complex is capable of undergoing metal to ligand charge transfer upon photoexcitation.

26. The material according to claim 25 wherein said cationic transition metal coordination complex is a complex of a transition metal atom selected from the group consisting of Re(I), Fe(II), Ru(II), Os(II), Co(III), and Ir(III).

27. The material according to claim 26 wherein said cationic transition metal coordination complex and said borate anion are present as an ion pair.

28. The material according to claim 26 wherein at least one of said ligands includes a heterocyclic group containing a nitrogen atom.

29. The material according to claim 26 wherein at least one of said ligands is selected from the group consisting of pyridine, 2,2'-bipyridine, 4,4'-dimethyl-2,2'-bipyridine, 1,10-phenanthroline, 3,4,7,8-tetramethyl-1,10-phenanthroline, 2,2',2"-terpyridine, 5,6-dimethyl-1,10-phenanthroline, 5-methyl-1,10-phenanthroline, 5-chloro-1,10-phenanthroline, 5-nitro-1,10-phenanthroline, 4,7-dimethyl-1,10-phenanthroline and 2,4,6-tri(2-pyridyl-s-triazine).

30. The material according to claim 26 wherein at least one of said ligands is a bidentate or tridentate ligand.

31. The material according to claim 22 wherein said photoinitiator is capable of absorbing actinic radiation and producing free radicals as a result of exposure to light emitted from a visible light source.

32. The material according to claim 23 wherein said composition additionally comprises an image-forming agent.

33. The material according to claim 32 wherein said image-forming agent comprises a colorless color-forming agent which forms an image upon contact with a developer material.

34. The material according to claim 33 wherein said compound comprises an ethylenically unsaturated compound.

35. The material according to claim 34 wherein said microcapsules include a first set of microcapsules having a cyan image-forming agent associated therewith, a second set of microcapsules having a magenta image-forming agent associated therewith and a third set of microcapsules having a yellow image-forming agent associated therewith, wherein at least one of said first, second and third sets of microcapsules contains said photoinitiator including said cationic transition metal coordination complex and said borate anion.

36. The material according to claim 35 wherein said microcapsules upon imagewise exposure to three distinct wavelengths of actinic radiation which respectively image-wise harden said first, second and third sets of microcapsules are capable of forming a full color image on a developer material.

37. The photosensitive material of claim 36 wherein said three distinct wavelengths correspond to red, green and blue light.

* * * * *

UNITED STATES PATENT AND TRADEMARK OFFICE
CERTIFICATE OF CORRECTION

PATENT NO. : 4,954,414
DATED : September 4, 1990
INVENTOR(S) : Paul V. Adaor, et. al.

It is certified that error appears in the above-indentified patent and that said Letters Patent is hereby corrected as shown below:

Column 16, line 12, "pyridyl-s-triazine" should be --pyridyl-s-triazine)--

Column 16, line 40, delete "composition";

Column 18, line 44, "imagewise" should be --image-wise--.

Signed and Sealed this

Twenty-eighth Day of September, 1993

Attest:

BRUCE LEHMAN

Attesting Officer

Commissioner of Patents and Trademarks